(12) United States Patent
Ruckerbauer

(10) Patent No.: US 7,439,615 B2
(45) Date of Patent: Oct. 21, 2008

(54) SEMICONDUCTOR COMPONENT COMPRISING AN INTEGRATED SEMICONDUCTOR CHIP AND A CHIP HOUSING, AND ELECTRONIC DEVICE

(75) Inventor: Hermann Ruckerbauer, Moos (DE)

(73) Assignee: Qimonda AG, Munich (DE)

( * ) Notice: Subject to any disclaimer, the term of this patent is extended or adjusted under 35 U.S.C. 154(b) by 87 days.

(21) Appl. No.: 11/657,407

(22) Filed: Jan. 24, 2007

(65) Prior Publication Data

US 2007/0194447 A1 Aug. 23, 2007

(30) Foreign Application Priority Data

Jan. 24, 2006 (DE) .................... 10 2006 003 377

(51) Int. Cl.
*H01L 23/12* (2006.01)

(52) U.S. Cl. .................... 257/700; 257/723; 257/773

(58) Field of Classification Search ................ 257/678, 257/690, 700, 723, 773, 776, 777
See application file for complete search history.

(56) References Cited

U.S. PATENT DOCUMENTS

| 6,313,522 | B1 | 11/2001 | Akram et al. |
| 6,603,198 | B2 * | 8/2003 | Akram et al. ............... 257/686 |
| 6,740,546 | B2 | 5/2004 | Corisis et al. |
| 6,791,193 | B2 * | 9/2004 | Watanabe et al. ........... 257/777 |
| 6,977,440 | B2 * | 12/2005 | Pflughaupt et al. .......... 257/777 |
| 7,193,306 | B2 * | 3/2007 | Akram et al. ............... 257/686 |
| 7,279,786 | B2 * | 10/2007 | Kim .......................... 257/686 |
| 7,335,995 | B2 * | 2/2008 | Pflughaupt et al. .......... 257/779 |
| 2005/0044305 | A1 | 2/2005 | Jakobs et al. |

* cited by examiner

*Primary Examiner*—Kevin M Picardat
(74) *Attorney, Agent, or Firm*—Slater & Matsil, L.L.P.

(57) ABSTRACT

A semiconductor component includes an integrated semiconductor chip and a chip housing. The chip housing has first, second, third and fourth conductor tracks that connect input and output connections of the semiconductor chip to external contact connections on the underside and top side of the chip housing in such a way that a loop back interconnection of a plurality of semiconductor components stacked one on top of another is made possible without subsequent structural alterations to the chip housings thereof.

29 Claims, 6 Drawing Sheets

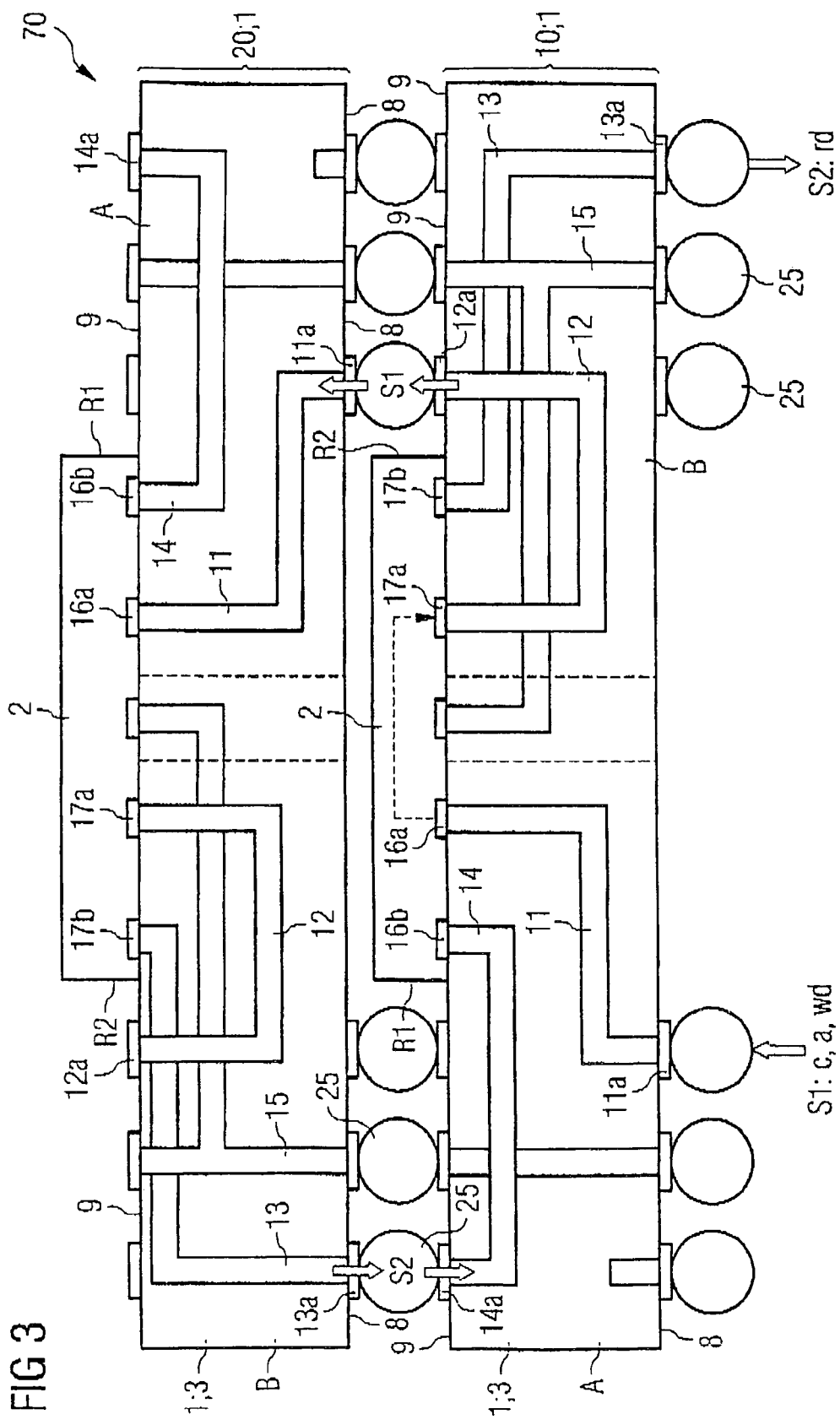

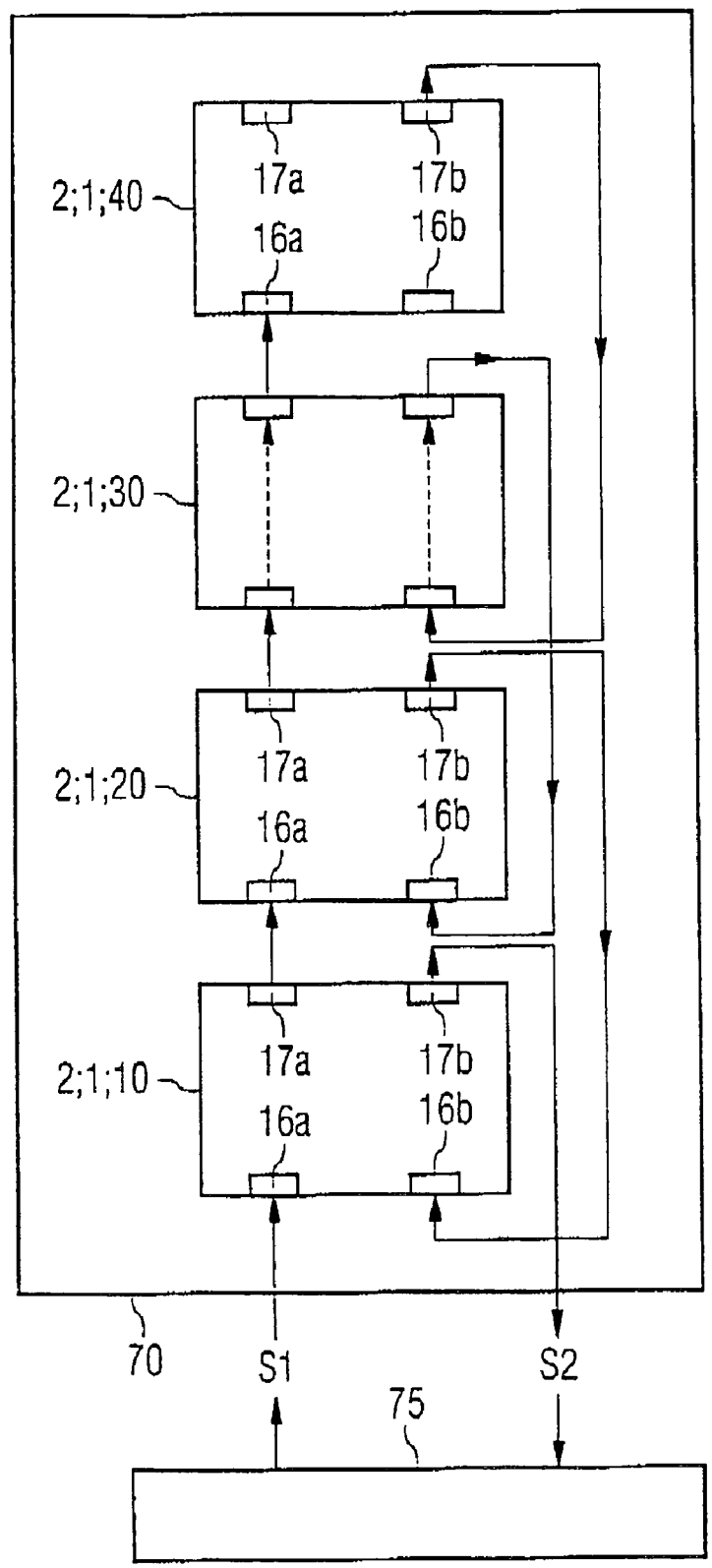

SEMICONDUCTOR COMPONENT COMPRISING AN INTEGRATED SEMICONDUCTOR CHIP AND A CHIP HOUSING, AND ELECTRONIC DEVICE

This application claims priority to German Patent Application 10 2006 003 377.9, which was filed Jan. 24, 2006 and is incorporated herein by reference.

TECHNICAL FIELD

The invention relates to a semiconductor component comprising an integrated semiconductor chip and a chip housing. The invention furthermore relates to an electronic device comprising a plurality of semiconductor components.

BACKGROUND

Semiconductor components usually comprise a semiconductor chip, in which an integrated microelectronic circuit is embodied, and a chip housing, which serves for externally driving the semiconductor chip and enables the semiconductor chip to be mounted on a superordinate electronic unit, for instance on an electronic printed circuit board (PCB) or else on a housing of a further semiconductor chip. Particularly on memory modules, the semiconductor components are usually no longer only arranged alongside one another directly on one or both main surfaces of the electronic printed circuit board, but are also stacked one above another, so that, on each surface region of the printed circuit board at which a semiconductor component is mounted, said semiconductor component carries one or more further semiconductor components. Consequently, on each surface region of the printed circuit board provided for semiconductor components, there is situated in each case a stack of a plurality of semiconductor components which are arranged one on top of another and which can be driven jointly by the printed circuit board of the memory module or of some other superordinate electronic unit.

The chip housings are often embodied as BGA housings (Ball Grid Array) which have, on their underside, two arrays of contact connections which can be mounted at a printed circuit board by means of soldering connections, and which have, in a central region on their top side, chip-side contact connections for making contact with the semiconductor chip. Within the chip housing, said connections are connected to the contact connections on the underside of the chip housing by means of conductor tracks. As a result, the semiconductor chip can be driven via the chip housing by an electronic printed circuit board or a further semiconductor component carrying the chip housing.

The chip housings, which are usually embodied mirror-symmetrically with respect to the housing frame, thus have a first region and a second region (approximately corresponding to the two housing frame halves provided with contact arrays on the underside) which extend laterally beyond a respective edge of the semiconductor chip. By way of example, a first region of the chip housing, which has a first arrangement of contact connections on its underside, extends in a positive x-direction beyond a first edge of the semiconductor chip, whereas another, second region of the chip housing having a further, second array of contact connections extends in a negative x direction beyond an opposite second edge of the semiconductor chip. The housing frame is embodied mirror-symmetrically with respect to the center between the two arrays of contact connections, and the semiconductor chip is generally arranged in the center between the two arrays of contact connections, but usually on the top side of the chip housing.

The conductor tracks running within the chip housing may comprise horizontal conductor track segments, that is to say conductor track segments running parallel to the top side and underside of the chip housing, and also vias, that is to say conductive contact hole fillings running perpendicular to the top side and underside. Usually, when viewed from outside, the construction of a BGA housing is mirror-symmetrical with respect to the center between the two edges of the semiconductor chip arranged on the chip housing. Thus, generally a pair of two arrays (or arrangements) of contact connections, which generally comprise the same number of contact connections, is provided on the underside of the chip housing. Accordingly, the chip housing also has two regions which extend to opposite sides beyond the edges of the semiconductor chip. As viewed from the plan view, the semiconductor chip is mounted on the chip housing in a position which lies precisely in the center between the two arrays or arrangements of contact connections. However, the contact connections are generally arranged on the underside, whereas the semiconductor chip is generally arranged on the top side of the BGA housing.

When electrically driving a plurality of semiconductor components, in particular a plurality of housed semiconductor chips, it is customary to conduct all signals for driving or reading from the semiconductor components through all the semiconductor components. Thus, in the case of, for example, four semiconductor components connected in series, the signals for all four semiconductor components are forwarded with the aid of the same lines. Said lines also comprise line sections within those semiconductor components themselves.

The signals to be communicated to the semiconductor components comprise, inter alia, control commands, address commands and data values to be stored. These signals are referred to hereinafter as first signals. Further signals, which comprise in particular the data values to be read out or data values that have been read out from the semiconductor components, are referred to hereinafter as second signals. The first and second signals may additionally in each case also comprise at least one clock signal which supports the temporal coordination during the high-frequency communication of said signals.

First lines are usually provided for the communication of the first signals, along which first lines the first signals are routed through the semiconductor components connected in series, beginning with a first semiconductor component and ending with a last semiconductor component of the series circuit, from which they are conducted further to the printed circuit board of the superordinate electronic unit (for example of the memory module). For the second signals, by contrast, second lines are provided, with the aid of which the data values to be read out are likewise routed through all the semiconductor components connected in series.

The order in which the second signals pass through the semiconductor components connected in series may be identical to the order in which the first signals pass through the semiconductor components, may be identical to the order in which the second signals pass through the semiconductor components, or may deviate from said order. If the order for the first and second signals is identical in each case, this is called a PLF (parallel loop forward) interconnection. However, if the second signals or the data values that have been read out pass through the interconnected semiconductor components in a different order, in particular in a reverse order, with respect to the first signals, this is called a loop back interconnection.

Semiconductor components are usually embodied for one of these two types of communication of the first and second signals, with the result that a chip housing developed for a loop forward configuration must normally be used for this configuration. If such a chip housing (and the semiconductor component formed using said chip housing and a semiconductor chip) is intended to be used for a loop back configuration, subsequent constructive changes are necessary for at least one of the chip housings that are to be interconnected. This holds true particularly when a plurality of housings of the semiconductor chips are to be stacked one on top of another. In the case of a chip housing for a semiconductor component that is to be interconnected in accordance with the loop forward configuration, in particular the second lines, that is to say the lines for communicating the data values read out, lead on the output side to the top side of the chip housing. Since contact is made with the chip housing from the underside, however, the data values read out have to be forwarded from the top side to the underside. This is done with the aid of contact hole fillings or other conductive structures that reach from the top side as far as the underside of the chip housing. Such conductive connections may already be contained in a conventional chip housing for the loop forward configuration. In order, however, to prepare said chip housing for a loop back configuration, that contact on the top side which is conductively connected to a contact connection on the underside of the chip housing and would therefore be suitable for feeding back the data values downward, must subsequently be conductively connected to an output connection of the semiconductor chip. For this purpose, a conductive connection between this conducting line path and a corresponding chip-side connection of the chip housing subsequently has to be prepared on the top side.

Consequently, conventional semiconductor components cannot be used for a loopback configuration without subsequent constructive changes.

Apart from this additional outlay, a further disadvantage initially consists in the fact that the above-described additional conductive connections from the top side to the underside are actually necessary for feeding back the data values. Although the requisite contact connections on the underside are already present within the arrangements of contact connections, they increase the basic surface to be reserved for electrically driving the semiconductor components.

In order to be able to feed back the data values in accordance with the loopback configuration, it is necessary, therefore, for additional contact connections on the underside of the chip housing to be through-connected upward, thereby increasing the outlay in the mounting of the chip housings. Moreover, the contact connections that are to be additionally utilized for a subsequently provided loopback configuration for feeding back the data values read out enlarge the contact surface arrays not only of the chip housings themselves but also the regions of the electronic printed circuit board which are to be reserved for making contact with the semiconductor components. This additionally restricts the possibilities for the design of the conducting line courses on the part of the printed circuit board which drive the semiconductor components.

SUMMARY OF THE INVENTION

In one aspect, the present invention provides a semiconductor component that can be interconnected in a loopback configuration without such an additional outlay and without subsequent constructive changes. The semiconductor component according to embodiments of the invention is intended to be suitable, in particular, for making it possible, in the event of a plurality of the semiconductor components being stacked, to effect a loopback interconnection of the stacked semiconductor components without any problems, for example, without subsequent constructive changes to one or a plurality of semiconductor components. Finally, the semiconductor component according to embodiments of the invention are intended to be drivable with compact arrangements of contact connections on its underside and, in particular, not to require use of additional contact connections subsequently connected to the semiconductor chip of the semiconductor component. Furthermore, embodiments of the present invention provide an electronic device having a plurality of such semiconductor components.

In a first embodiment, a semiconductor component includes an integrated semiconductor chip and a chip housing. The semiconductor chip has two mutually opposite lateral edges and has input and output connections on at least one main surface. The chip housing extends laterally beyond the two mutually opposite edges of the semiconductor chip. A first region of the chip housing extends laterally as far as the outside of a first edge of the semiconductor chip and a second region of the chip housing extends in an opposite direction laterally as far as the outside of a second edge of the semiconductor chip. The chip housing has a top side and an underside, on which contact connections are in each case provided in the first and in the second region of the chip housing, the contact connections being connected to the input and output connections of the semiconductor chip by conductor tracks within the chip housing. The chip housing has first lines for first signals and the first lines comprise first and second conductor tracks. The chip housing has second lines for second signals and the second lines comprise third and fourth conductor tracks The first and the third conductor tracks lead from the semiconductor chip to contact connections of the chip housing that are arranged on its underside, and the second and the fourth conductor tracks lead from the semiconductor chip to contact connections of the chip housing that are arranged on its top side. The first conductor tracks are connected to input connections and the second conductor tracks are connected to output connections of the semiconductor chip for the first signals, whereas the third conductor tracks are connected to output connections and the fourth conductor tracks are connected to input connections of the semiconductor chip for the second signals.

Embodiments of the invention provide for the semiconductor component to have first lines for forwarding first signals and second lines for forwarding second signals. The first and second lines run partly through the chip housing, also partly through the semiconductor chip. In particular, each first and second line comprises two conductor tracks that run within the chip housing, in each case one conductor track being connected to an input connection and the respective other conductor track being connected to an output connection of the semiconductor chip. The two conductor tracks lead from said connections to the top side and underside of the chip housing. In the case of the first lines, the conductor tracks thereof are referred to below as first and second conductor track, and in the case of the second lines, the conductor tracks thereof are referred to below as third and fourth conductor tracks. The conductor tracks of the first lines communicate first signals, in particular control commands, address commands and data values to be stored or written. The second lines serve for communicating second signals, in particular the data values that have been read out or are to be read out.

The first and the third conductor tracks lead from the semiconductor chip to contact connections of the chip housing which are arranged on its underside, and the second and fourth conductor tracks lead from the semiconductor chip to contact connections which are arranged on the top side of the chip housing. The second and fourth conductor tracks thus enable a plurality of identical semiconductor components to be stacked one on top of another and enable electrical contact to be made with the upper semiconductor chips.

The first conductor tracks lead from the underside of the chip housing to input connections of the semiconductor chip and the second conductor tracks lead from output connections of the semiconductor chip to the top side of the chip housing. Embodiments of the invention provides for the third conductor tracks, which lead to the underside of the chip housing, to be connected to output connections of the semiconductor chip and for the fourth conductor tracks, which lead to the top side of the chip housing, to be connected to input connections of the semiconductor chip. This enables a loopback interconnection, without any problems, of a plurality of semiconductor chips stacked one above another since, in the case of the embodiment of the chip housing according to the invention, the data values read out are automatically transported to the underside of the chip housing instead of to the top side thereof. Consequently, as many semiconductor chips according to embodiments of the invention as desired can be stacked one above another without the data values read out having to be conducted from the topmost semiconductor chip via additional conductive connections through the entire stack of semiconductor components as far as the underside of the housing of the bottommost semiconductor component. Instead of this, in the case of the semiconductor components according to embodiments of the invention, the data values are automatically transported from an output connection of the semiconductor chip via a respective third conductor track to the underside of the housing. If a plurality of semiconductor components are stacked one above another, the data values read out from all the semiconductor chips are conducted from the topmost semiconductor component in order as far as the bottommost semiconductor component, to be precise, in each semiconductor component (apart from the topmost one), firstly proceeding from the top side of the chip housing along the fourth conductor tracks as far as the input connection of the semiconductor chip for the data values, and then from the output connection of the semiconductor chip for the data values via the third conductor tracks as far as the underside of the chip housing. There they are forwarded to the fourth conductor tracks of the semiconductor component respectively arranged underneath.

Consequently, in the case of the semiconductor components according to embodiments of the invention, those conductor tracks (namely the third conductor tracks) which are intended for forwarding the data read out from the semiconductor chip are connected to contact connections on the underside of the chip housing, and the fourth conductor tracks, which are intended at input connections of the semiconductor chip for data values that have been read out elsewhere and to be read through the semiconductor chip, are arranged with their opposite end at the top side of the chip housing. This enables a loopback interconnection of a plurality of semiconductor chips stacked one on top of another without subsequent constructive changes to the chip housing.

In accordance with a first embodiment, it is provided that those conductor tracks of the first and second lines which are connected to input connections of the semiconductor chip are arranged in the first region of the chip housing, and that those conductor tracks of the first and second lines which are connected to output connections of the semiconductor chip are arranged in the second region of the chip housing.

In accordance with this first embodiment, those conductor tracks for communicating the first and second signals which are connected to input connections of the semiconductor chip are arranged in the same (first) half of the chip housing and thus connected to contact connections on the underside of the chip housing which are in each case arranged in the same array of contact connections. Those conductor tracks for communicating the first and second signals which are connected to output connections of the semiconductor chip are then arranged in the other half of the chip housing and connected to contact connections of the second array of contact connections.

In particular, it is provided that the first and the fourth conductor tracks are arranged in the first region of the chip housing and the second and the third conductor tracks are arranged in the second region of the chip housing. This means that the first signals are received through the first conductor tracks on the underside of the first region (on the first half) of the chip housing, but are forwarded on the output side on the top side of the second region (the second half) of the chip housing. Conversely, the path for forwarding data values read out leads from the top side of the first half of the chip housing via the fourth and third conductor tracks to the underside of the opposite, second half of the chip housing. This semiconductor component is thus suitable for stacking with a plurality of semiconductor components of identical type in which semiconductor components arranged directly on one another are to be arranged on one another in a manner rotated in each case through 180° (rotated about the surface normal to the top side or underside through the center thereof).

Accordingly, it is provided that the contact connections of the second and fourth conductor tracks on the top side of the chip housing are arranged in a manner rotated through 180° relative to the positions of the contact connections of the first and third conductor tracks on the underside of the chip housing, relative to the midpoint of the semiconductor chip.

In a second preferred embodiment, it is provided that the first and the second conductor tracks are arranged in the first region of the chip housing and the third and the fourth conductor tracks are arranged in the second region of the chip housing. In this case, all the conductor tracks of the first lines, which serve for communicating the first signals, are situated in the same (first) half of the chip housing, which extends laterally beyond a first edge of the semiconductor chip. Conversely, the third and fourth conductor tracks serving for communicating the second signals end at the top side and underside of the opposite second half of the chip housing, which extends in the opposite direction beyond an opposite, second edge of the chip housing. Consequently, the line paths for communicating the first and second signals in each case end on the top side of the chip housing within the same half as on the underside of the chip housing.

Accordingly, it is provided that the contact connections of the second and of the fourth conductor tracks are arranged on the top side of the chip housing in such a way that their positions attain congruence in a lateral direction with the positions of the contact connections of the first and the third conductor tracks on the underside of the chip housing. The semiconductor component embodied in this way is thus suitable for stacking with a plurality of semiconductor components of identical type in the same orientation in each case one above another. In this case, the orientation of all the semiconductor components of the stack of components formed therefrom is identical.

It is preferably provided that the first lines conduct first signals from the underside of the chip housing via the semiconductor chip to the top side of the chip housing, whereas the second lines conduct second signals from the top side of the chip housing via the semiconductor chip to the underside of the chip housing. In particular, the data values read out are conducted from the chip-side output connections to the underside of the chip housing, whereas control commands, address commands and data values to be written for semiconductor components connected downstream are conducted to the top side of the respective chip housing.

It is preferably provided that the semiconductor component can be stacked with a plurality of semiconductor components of identical type in a manner such that the contact connections on the top side of one semiconductor component make contact with the contact connections on the underside of the other semiconductor component. Particularly simple contact-making results when the lateral positions (parallel to the top side of the chip housing) of the contact connections arranged there (of the conductor tracks leading toward the top side) correspond to those lateral positions which are assumed by the contact connections—arranged on the underside—of the conductor tracks that end there. Consequently, the contact-making plan or "footprint" on the top side and underside of the chip housing is identical, and such semiconductor components can be stacked one on top of another in large numbers with the same orientation in each case.

It is preferably provided that the semiconductor component can be stacked with a plurality of semiconductor components of identical type in a manner such that the plurality of semiconductor components can be placed on one another in identically oriented fashion or in a manner rotated in each case through 180° with respect to one another. Depending on whether it is desired to stack two semiconductor chips that are to be arranged one on top of another with or without alternation of the orientation of two directly adjacent semiconductor components, the chip housing is embodied in such a way that in the latter the first and second lines led from the underside to the top side end either in the same or on the opposite half of the chip housing with respect to on the underside.

It is preferably provided that the chip housing in each case has an arrangement of contact connections on its underside and its top side in its first and second region, wherein the contact connections of the first, second, third and fourth conductor tracks are arranged within said arrangements of contact connections. Consequently, some of the contact connections of said arrangements of contact connections are connected to the conductor tracks for communicating the first and second signals that end on the underside. The arrangements of contact connections furthermore contain further contact connections, for example for communicating clock signals in parallel with the first and/or second signals.

It is preferably provided that within the arrangements of contact connections, the contact connections are lined up at least along a first direction running parallel to the two lateral edges of the semiconductor chip. It is thus possible, by way of example, for in each case six lines for communicating the control commands, address commands and data values to be stored to be lined up along the first direction in one or both arrangements of contact connections.

It is preferably provided that the contact connections of the first conductor tracks are arranged along the first direction in a central region of an arrangement of contact connections and that the contact connections of the second lines are arranged along the first direction in two outer partial regions of an arrangement of contact connections, wherein the central partial regions lie along a first direction between the two outer partial regions of the respective arrangement of contact connections. By way of example, along the first direction, it is possible firstly for two lines for communicating data values that have been read out to succeed one another, then six lines for communicating the control commands, address commands and data values to be stored, and subsequently two further lines for communicating the data values read out.

It may be provided that along a second direction, along which the two edges of the semiconductor chip are spaced apart from one another, the contact connections of the second and the third conductor tracks are arranged at a different distance from the semiconductor chip than the contact connections of the first and the fourth conductor tracks.

In accordance with an alternative preferred embodiment, however, it is provided that along the second direction along which the two edges of the semiconductor chip are spaced apart from one another, the contact connections of the first, second, third and fourth conductor tracks are in each case arranged at the same distance from the semiconductor chip. If, with regard to the high-frequency and reliable transmission of the first and second signals, each conductor track is embodied as a line pair of two mutually complementary individual lines, the embodiment described here means that although the distance between the two respective individual lines that are complementary to one another may be different for the two individual lines, it is uniform for all first, second, third and fourth conductor tracks which are formed from in each case two individual lines. Extremely compact arrangements of contact connections on the underside of the chip housing are obtained in this case, too.

It is preferably provided that the first lines comprise control lines, address lines and data lines for data to be written in, and that the second lines comprise data lines for data that are to be read out or have been read out.

It may furthermore be provided that the first lines additionally comprise at least one clock signal line, and that the second lines likewise comprise at least one clock signal line. The temporal coordination in the high-frequency communication of the first and second signals is improved with the aid of the clock signal lines concomitantly carried in parallel.

It may accordingly be provided that each conductor track of the first and second lines is embodied as a pair of two individual lines wherein the two individual lines of a respective pair serve for transmitting mutually complementary data bits. The conductor tracks of the third and fourth lines may correspondingly in each case be embodied as a pair of two individual lines which in each case communicate mutually complementary data bits.

It is preferably provided that the integrated semiconductor chip has a dynamic random access memory; the latter will be embodied in the form of an integrated memory circuit in the semiconductor chip and be connected, on a main surface of the semiconductor chip, to first input and output connections for the first signals and to second input and output connections for the second signals. Consequently, line sections of the first and second lines which connect the first conductor tracks of the chip housing to the second conductor tracks of the chip housing, and also further line sections, which connect the third conductor tracks to the fourth conductor tracks of the chip housing, run within the semiconductor chip. Consequently, the line paths for the first and second signals in each case lead firstly via a conductor track of the chip housing, then via a line section within the semiconductor chip and then via a further conductor track of the chip housing.

Finally, it may be provided that the contact connections arranged on the underside of the chip housing are provided with solder balls. The semiconductor component prepared in this way can be placed directly onto a further semiconductor component or onto an electronic printed circuit board.

In another aspect, the provides an electronic device having at least two semiconductor components according to one of the embodiments disclosed here, wherein the semiconductor components are stacked one above another in a manner such that the contact connections on the top side of each semiconductor component that carries at least one next higher semiconductor component are conductively connected to contact connections arranged on the underside of said next higher semiconductor component. In the case of this electronic device comprising two or more semiconductor components, each of which is embodied in the manner according to one of the embodiments of the invention, a loopback interconnection is automatically achieved since the fourth conductor tracks in each case leading to the top side of the housing are connected to input connections of the semiconductor chip (instead of to output connections) for the data values read out and the third lines joining the underside of the chip housing are connected to output connections of the semiconductor chip (instead of to input connections) for the data values that have been read out and are to be forwarded. Consequently, each semiconductor component conducts the data values that have been read out from its top side to its underside, that is to say to the next deeper semiconductor component, whereas each semiconductor component conducts the first signals from its underside to the top side, that is to say to the next higher semiconductor component.

It is preferably provided that the second conductor tracks of each semiconductor component that carries at least one next higher component are in each case short-circuited with the first conductor tracks of the next higher semiconductor component, and that the fourth conductor tracks of each semiconductor component that carries at least one next higher semiconductor component are short-circuited with the third conductor tracks of the next higher semiconductor component. Consequently, the third and fourth conductor tracks form a line path reaching from the topmost semiconductor component to the bottommost semiconductor component for the data values read out, which are conducted along said path from the topmost as far as the bottommost semiconductor component.

It may be provided that the next higher semiconductor component is in each case arranged on the semiconductor component arranged underneath in a manner rotated through 180° with respect to said semiconductor component arranged underneath.

As an alternative, it may be provided that all the semiconductor components of the electronic device are stacked one on top of another in identically oriented fashion.

It is preferably provided that the electronic device has precisely two semiconductor components stacked one above another. As an alternative, it is provided that the electronic device has precisely four semiconductor components stacked one above another. As an alternative, any arbitrary other number of semiconductor components can be stacked one above another.

It is preferably provided that the first, second, third and fourth conductor tracks of the first and second lines of all the semiconductor components run in such a way that the second signals pass through the semiconductor components stacked one on top of another in an opposite order to the first signals. This corresponds to the preferred case of a loopback configuration.

It is preferably provided that the first signals comprise control commands, address commands and data values to be stored, and that the second signals comprise data values that are to be read out or have been read out. The first and second signals may furthermore in each case comprise at least one clock signal.

It is preferably provided that the third and fourth conductor tracks of the semiconductor components of the electronic device run in such a way that the data values of the semiconductor chips that have been read out are forwarded in a cyclic order, in each case beginning with the data values of the semiconductor chip of a topmost semiconductor component and ending with the data values of the semiconductor chip of a bottommost semiconductor component. In this case, the data values are read out in cyclic, periodic order from the semiconductor components stacked one above another and are also forwarded in this way, in which case, within the data stream of the jointly communicated data values, the order of the assignment to the individual semiconductor components is the same as the order of this assignment in the case of the first signals. In particular, the data values read out from the topmost semiconductor component can successively pass through the semiconductor components stacked one above another, beginning with the topmost semiconductor component and ending with the bottommost semiconductor component.

BRIEF DESCRIPTION OF THE DRAWINGS

Embodiments of the invention are described below with reference to the figures, in which:

FIG. 3 shows an electronic device comprising two semiconductor components in accordance with FIG. 1;

FIG. 6 shows a schematic circuit diagram with a plurality of interconnected semiconductor components.

DETAILED DESCRIPTION OF ILLUSTRATIVE EMBODIMENTS

Figure 1:
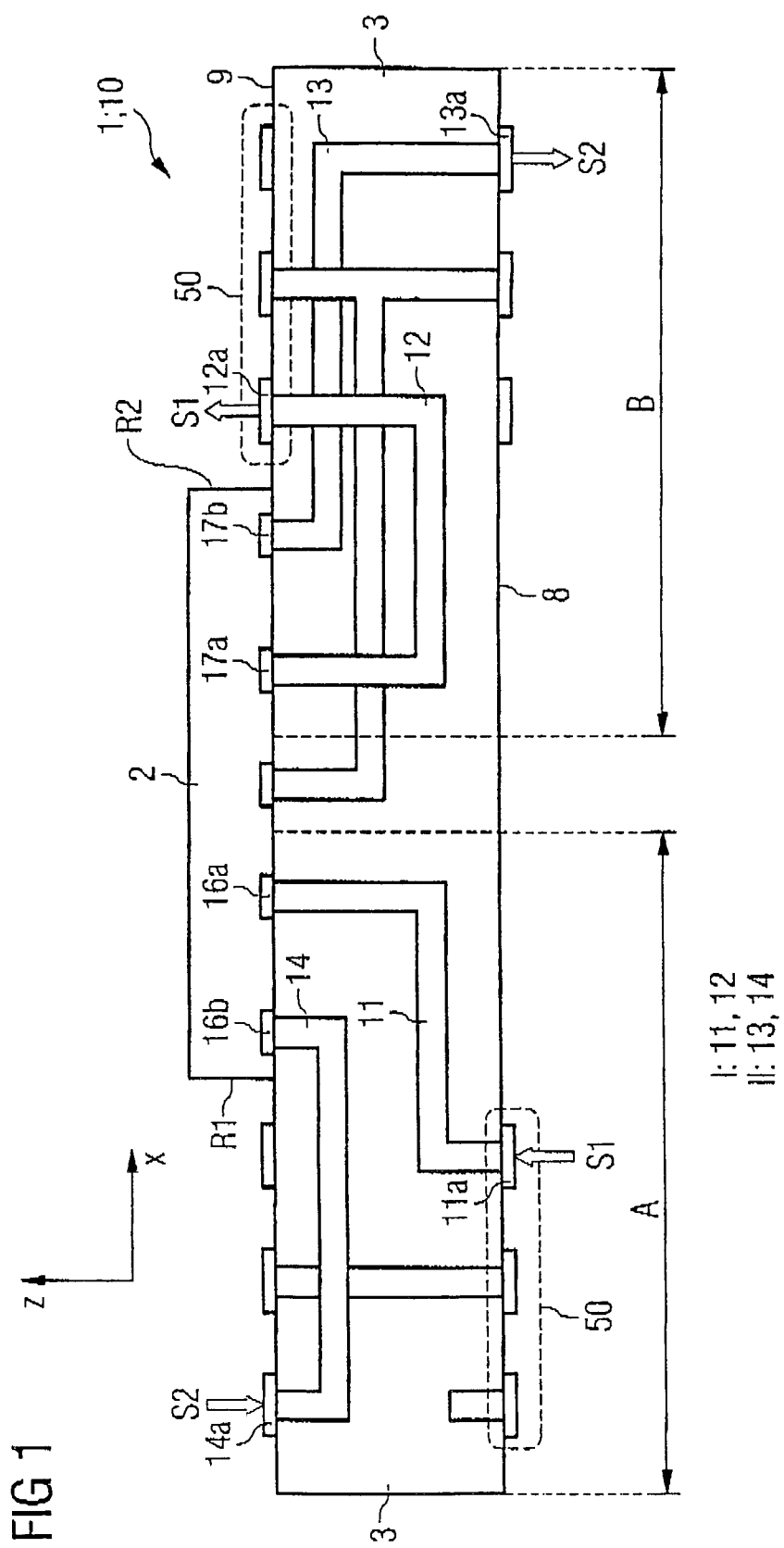
FIG. 1 shows a first semiconductor component according to a first embodiment of the invention.

FIG. 1 shows a semiconductor component according to the invention in accordance with a first embodiment. The semiconductor component 1 has an integrated semiconductor chip 2 and a chip housing 3, which is preferably embodied as a BGA housing (Ball Grid Array). The chip housing 3 connects input and output connections of the semiconductor chip 2 by means of conductor tracks, running within the chip housing, to contact connections on the top side and underside of the chip housing. The contact connections arranged on the underside 8 can be connected to a structurally superordinate unit, for example to a printed circuit board of a memory module, for instance with the aid of solder balls. The semiconductor chip 2 can thereby be driven electrically via the conductor tracks running in the chip housing 3.

The chip housing 3 extends laterally along a first direction x to both sides beyond lateral edges R1, R2 of the chip housing and has, on its top side 9 and its underside 8, in each case two arrangements of relatively densely packed contact connections serving for making contact with the semiconductor component. In the cross-sectional view of FIG. 1, by way of example, the arrangement 50 of contact connections which is arranged laterally outside the second edge R2 and is arranged on the top side 9 of the chip housing 3 is illustrated with a dashed border, as is the arrangement 50 of contact connections situated laterally outside the first edge R1 on the underside 8 of the chip housing 3. Two further arrangements are not identified in any greater detail for the sake of clarity; they are respectively situated in the other of the two regions A and B. The chip housing 3, at least with regard to its outer form, is preferably embodied symmetrically with respect to the center between the two halves A and B of the chip housing. The arrangements 50 of contact connections contain a multiplicity of further contact connections, for example in each case ten or more, in a direction perpendicular to the plane of the drawing of FIG. 1. Some contact connections are utilized for electrically driving the semiconductor component 1, namely those which are connected to the input and output connections of the semiconductor chip 2 with the aid of the conductor tracks within the chip housing 3.

In particular, first conductor tracks 11 are provided, of which only a single one is illustrated in the cross-sectional view of FIG. 1, but a plurality (for example six) of first conductor tracks 11 aligned up alongside one another in a direction perpendicular to the plane of the drawing. The first conductor tracks 11 lead from first contact connections 11a on the underside 8 of the chip housing 3 as far as (first) input connections 16a of the semiconductor chip 2 and serve for communicating first signals S1, in particular control commands, address commands and data values to be written. Second conductor tracks 12 lead from (first) output connections 17a of the semiconductor chip 2 for the first signals S1 to second contact connections 12a on the top side 9 of the chip housing 3, whereby the first signals can be communicated to further semiconductor components which can be stacked on the semiconductor component 10. As a result, still further semiconductor components can be driven via the semiconductor chip 10.

The semiconductor component 10 furthermore has third conductor tracks 13 leading from (second) output connections 17b of the semiconductor chip 2 to third contact connections 13a on the underside 8 of the semiconductor component. Furthermore, the embodiments of the invention provide for fourth conductor tracks 14 to lead from (second) input connections of the semiconductor chip 2 to fourth contact connections 14a on the top side 9 of the chip housing 3. The third and fourth conductor tracks serve for communicating second signals S2, in particular data values that have been read out or are to be read out. The first and second conductor tracks 11 and 12 together form the first lines I, which serve for communicating the first signals S1. Likewise, the third and fourth conductor tracks 13 and 14 jointly form the second lines II, which serve for communicating the second signals S2. Since, according to embodiments of the invention, those (namely the third) conductor tracks 13 which connect the output-side connections 17b of the semiconductor chip 2 for the second signals S2 to contact connections 13a on the underside (instead of to those on the top side 9) of the chip housing 3 and since, according to embodiments of the invention, the fourth conductor tracks 14 connect the input connections 16b to the fourth conductor tracks 14 at contact connections 14a on the top side 9 (instead of on the underside 8), the semiconductor component forwards the second signals S2 in the opposite direction to a conventional component, namely from its top side to its underside. This is not the case with conventional semiconductor components since they are provided for loop forward configurations. If conventional semiconductor components are used for a loopback configuration, then the second signals emerging on the top side of the chip housing (the data values to be read out) are conducted away with the aid of a conductive bridge that leads to a through contact that is still free on the top side of the housing. Said through contact produces a conductive connection from the top side 9 to the underside 8 of the chip housing and makes contact with a further contact connection there. A subsequent processing of the chip housing and thus of the semiconductor component is required for the embodiment of the conductive bridge to said conductive connection, which represents the through-contact connection. Even in the case of semiconductor components stacked one above another, such a subsequent processing is necessary at least at the topmost semiconductor component in order, with the aid of through-contact connections that are still free, to conduct the signals to be read out from the top side of the topmost semiconductor component through all the semiconductor components back to the printed circuit board of the superordinate electronic unit.

This disadvantage is obviated in the case of the semiconductor component according to embodiments of the invention since the three lines 13 which end at the underside 8 of the chip housing are connected to the output connections 17b for the second signals S2, and since the fourth conductor tracks 14, leading to the top side 9 of the chip housing 3, are connected to the input connections 16b for the second signals S2. This is the other way round in the case of a conventional semiconductor component.

The semiconductor component according to embodiments of the invention makes it possible, by means of an altered interconnection of the input connections 16a and 16b and output connections 17a and 17b of the semiconductor chip 2, to use the entire semiconductor component for a loopback configuration in which, after the production of the semiconductor components and, if appropriate, stacking of said components one on top of another, there is no need for any subsequent processing, in particular subsequent alteration of the line paths at the topmost semiconductor component.

Figure 2A:
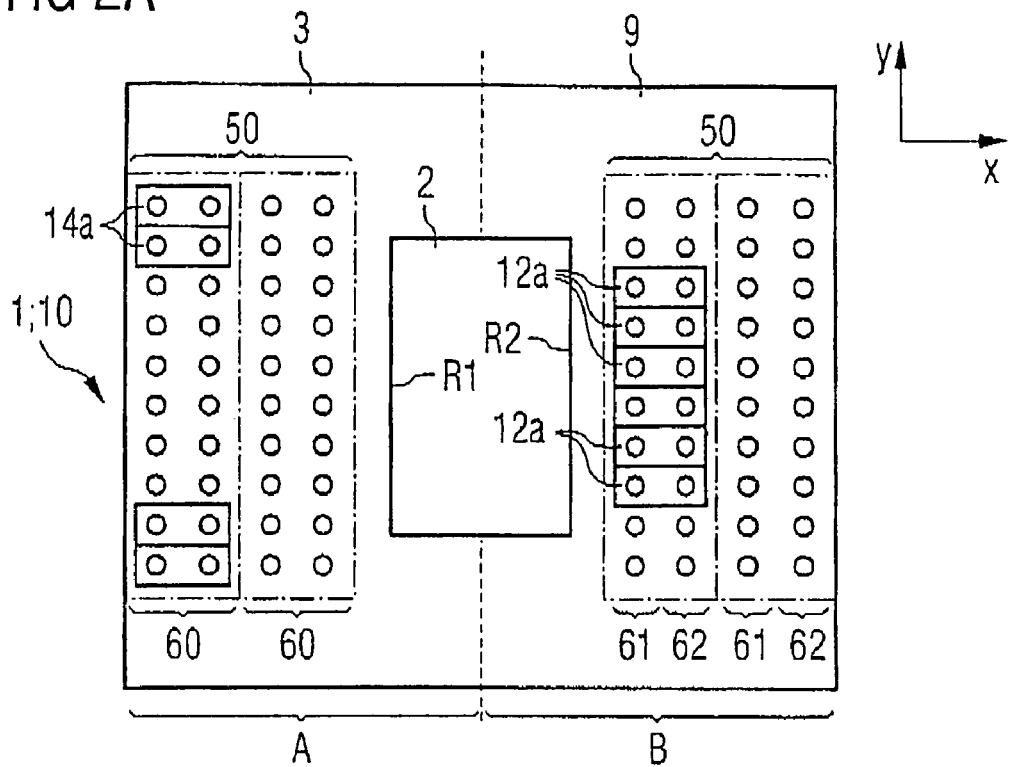
FIGS. 2A and 2B show plan views of the semiconductor component in accordance with FIG. 1.

FIG. 2A shows a schematic plan view of the semiconductor component according to the embodiment in accordance with FIG. 1 from the top, that is to say of the top side 9 of the chip housing with semiconductor chip 2 arranged thereon. The illustration additionally shows arrangements 50 of contact connections which are arranged in each of the two regions A and B of the chip housing 3 and enable contact to be made with a further semiconductor component to be arranged on the top side 9 of the semiconductor component 1. By way of example, an arrangement 50 comprising in each case an array of four times ten contact connections is illustrated on each half A and B, wherein in each case pairs 60 of contact connections comprising a first contact connection for a first individual line 61 and a second contact connection for a second individual line 62 jointly receive or forward a single differential signal. Corresponding individual lines proceed from the respective contact connections which are connected to the remaining mutually complementary conductor tracks. Only some of the contact connections of the arrangements 50 illustrated in FIG. 2A are used for electrically driving the semiconductor component 3, in particular the semiconductor chip 2 thereof. Those contact connections which are arranged on the underside of the semiconductor component are used for this purpose. This is not illustrated in FIG. 2A.

Figure 2B:
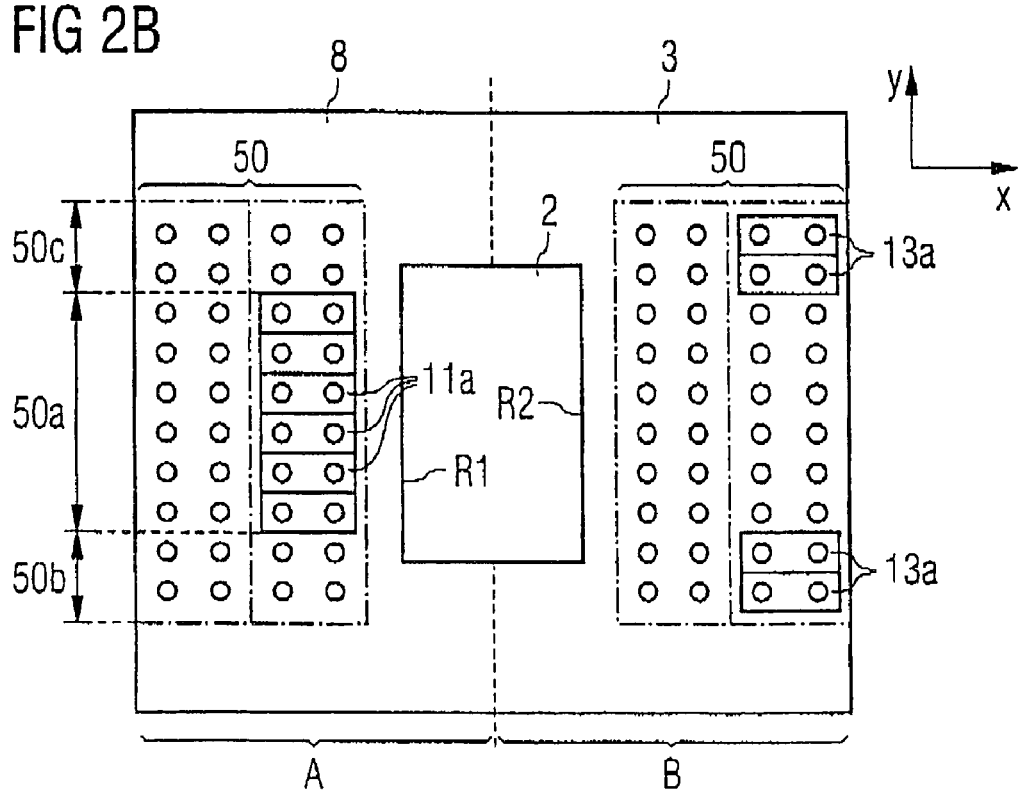

FIG. 2B therefore shows the arrangement of contact connections on the underside 8 of the chip housing 3, but seen from the same perspective as in FIG. 2A, namely from the top side above, that is to say in a phantom view through the semiconductor chip 2. In this case, the surface of the chip housing 3 is marked with the reference symbol 8 in order to illustrate that the contact connections illustrated in FIG. 2B which are described below are situated on the underside 8 of the chip housing 3.

In accordance with FIG. 2B, six contact connection pairs each having two contact connections 11a are provided, to be precise in the first region A of the chip housing 3. Corresponding first conductor tracks 11 lead from them to the input connections 16a of the semiconductor chip 2 for the first signals S1, said input connections being illustrated in FIG. 1. Said first conductor tracks 11 comprise control lines, address lines and data lines for data values to be written. Furthermore, third contact connections 13a for data values to be read out are provided on the underside 8 in FIG. 2B, to be precise in that arrangement 50 of contact connections which is situated in the second region B of the chip housing, that is to say laterally outside the second edge R2 of the semiconductor chip. In particular, in each case two pairs of third contact connections 13a are provided in two outer partial regions 50b and 50c arranged outside a central partial region 50a along a second lateral direction y. As a result, four digital data bits (including the respectively complementary data bits, which are likewise communicated for higher transmission reliability) can be transmitted simultaneously. The third conductor tracks 13 (FIG. 1) are connected to the third contact connections 13a, which conductor tracks, proceeding from output connections 17b of the semiconductor chip 2, forward the data values read out to the printed circuit board of a structurally superordinate unit.

The second lines 12 illustrated in FIG. 1 lead to second contact connections 12a, which in FIG. 2A are arranged in a central partial region of the arrangement 50 of contact connections which is arranged in the second region B of the chip housing 3. The second lines 12 thus forward the first signals proceeding from the output connections 17a to the second contact connections 12a, from where one or more semiconductor components that can be stacked on the semiconductor component 10 can be driven. Furthermore, fourth contact connections 14a are provided in the arrangement 50 illustrated on the left in FIG. 2A, which contact connections are connected via the conductor tracks 14 to the input connections 16b of the semiconductor chip 2 for the second signals S2. Data values to be read out from semiconductor components stacked on the semiconductor component 10 are forwarded via the fourth contact connections 14a, to be precise through the conductor tracks 13 and 14 of the semiconductor component 10 as far as a superordinate electronic unit at which the semiconductor component 10 is mounted.

As can be discerned on the basis of the comparison of the contact connections 11a, 12a, 13a and 14a used in FIG. 2A (top side 9) and FIG. 2B (underside 8), the arrangement of the contact connections 12a and 14a used on the top side 9 is rotated through 180° relative to the arrangement of the contact connections 11a and 13a used on the underside 8 (the two upper contact connections 14a in FIG. 2A lead to the two lower contact connections 13a in FIG. 2B). Consequently, a further semiconductor component can be mounted, in a manner rotated through 180°, on the semiconductor component illustrated in FIGS. 1, 2A and 2B and be driven via said semiconductor component.

An electronic device formed by the stacking of two semiconductor components is illustrated in FIG. 3.

The contact connections 11a and 14a and also the conductor tracks 11 and 14 are arranged on the left-hand side (region A) in the case of the lower semiconductor component 10, but on the right-hand side in the case of the upper semiconductor component 20 (likewise in the region A of this semiconductor component arranged in a manner rotated through 180°). With the aid of solder balls 25 on the underside 8 of the lower semiconductor component 10, the latter can be mounted at the printed circuit board of a superordinate electronic unit. Via the contact connections 11a and the conductor tracks 11, the semiconductor chip 2 of the lower semiconductor component 10 is supplied with the control signals, address signals and data values to be stored. In so far as these are intended for the upper semiconductor component 20, they are conducted through the lower semiconductor chip 2 (as indicated by the dashed arrow) and conducted through the second conductor tracks 12 of the lower semiconductor component 10 and the first conductor tracks 11 of the upper semiconductor component 20 as far as the semiconductor chip 2 of the upper semiconductor component 20 and are processed there. The data values to be read out are conducted from the output connections 17b of the upper semiconductor chip 2 via the third conductor tracks 13 of the upper semiconductor component 20 and the fourth conductor tracks 14 of the lower semiconductor component 10 to the input connections 16b of the lower semiconductor chip 2, are conducted through the latter as far as the output connections 17b and are forwarded along the third conductor tracks 13 of the lower semiconductor component 10 in the direction of the superordinate electronic unit, which reads out the data values rd to be read out, or the second signals S2.

The electronic device 70 in accordance with FIG. 3 contains two identical semiconductor components 10, 20 or 1 which are stacked one on top of another in a manner rotated through 180 degrees and the third and fourth lines 13 and 14 of which are connected up to the input and output connections 16b and 17b in such a way that the data values to be read out from each semiconductor component are forwarded from top to bottom. In contrast to conventional electronic devices in which the data values to be read out are conducted through the topmost semiconductor component, the need to subsequently produce, on the top side thereof, a conductive bridge to a still unused through contact downward is obviated. Consequently, a loopback interconnection configuration can be produced without additional measures.

Moreover, FIG. 3 also illustrates clock signal lines 15, which supply the respective semiconductor chips 2 with a clock signal. In addition, however, the first to fourth conductor tracks serving for the transmission of the first and second signals S1 and S2 may also in each case comprise a clock signal line; the latter may likewise be embodied as a pair of two individual lines. Preferably, both the lines for communicating the first signals S1 and the lines for communicating the second signals S2 in each case comprise a pair of clock signal lines.

Figure 4:
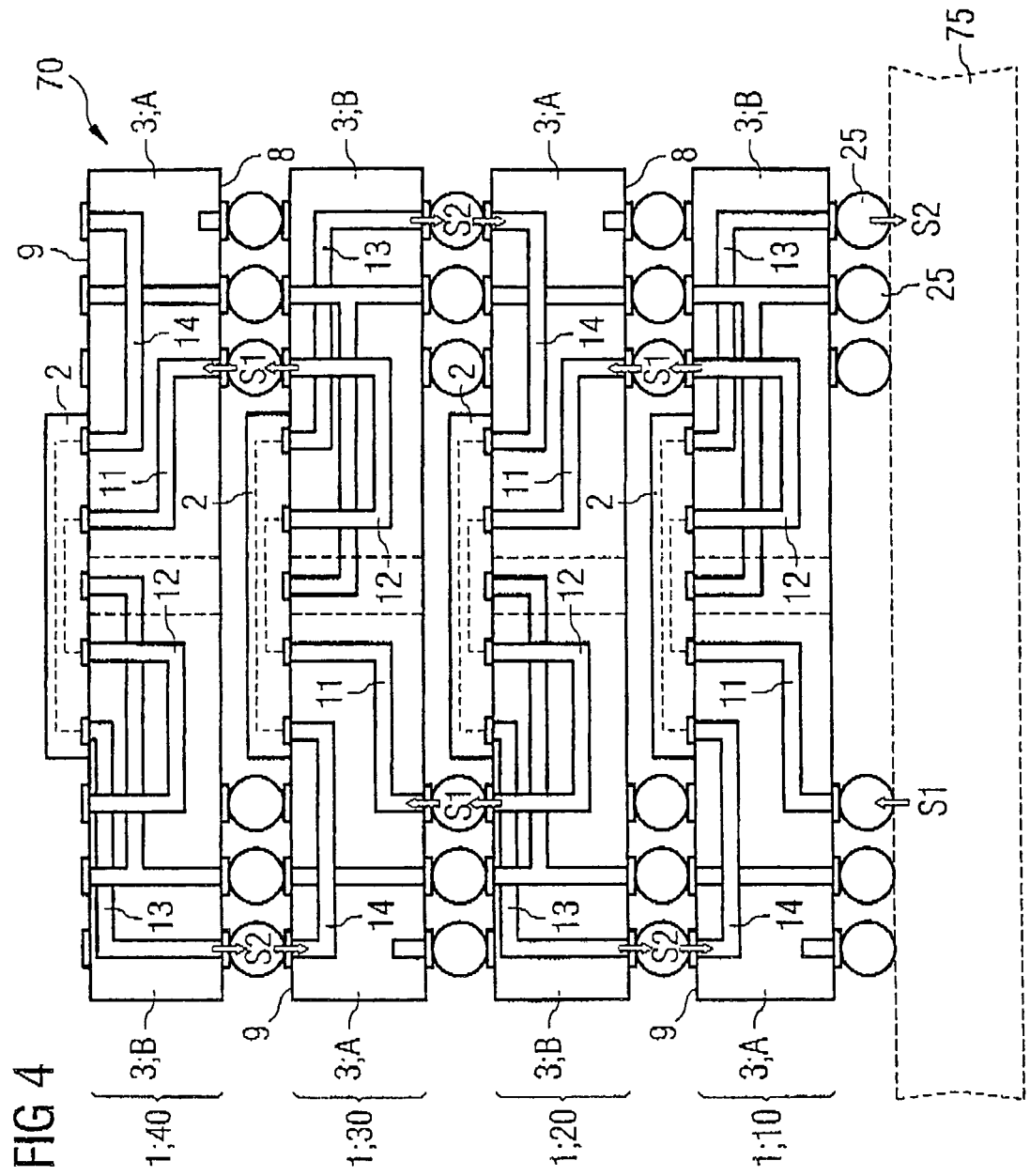
FIG. 4 shows an electronic device comprising four semiconductor components in accordance with FIG. 1.

FIG. 4 shows another electronic device 70, having four semiconductor components 1 or 10, 20, 30, 40 that are stacked one above another. The electronic device 70 can be fitted for example on the printed circuit board of a memory module or on an arbitrary region of a superordinate electronic unit 75. Solder balls 25, for example, which are also provided between the individual semiconductor components 10, are used for this purpose. Once again two semiconductor components that are directly adjacent one above another are in each case arranged one on top of another in a manner rotated through 180 degrees. The first signals S1, which are provided by the superordinate electronic unit 75, firstly pass through the first conductor tracks 11 of the bottommost semiconductor component 10, then the semiconductor chip 2 thereof and the second conductor tracks 12. From there, they are forwarded through the first conductor tracks 11 of the semiconductor component 20 that is second from the bottom, through the chip 2 of the second semiconductor component 20 and through the second conductor tracks 12 to the third semiconductor component 30. In the same way, the third semiconductor component forwards the first signals S1 until, through the first conductor tracks 11 of the topmost semiconductor component 40, until they finally reach the semiconductor chip thereof. The data values to be read out from the topmost semiconductor component 40 are forwarded through the third conductor tracks 13 thereof and the fourth conductor tracks 14 of the third semiconductor component 30 to the semiconductor chip 2 thereof, passed through the latter and, via the third conductor tracks 13 of the third semiconductor component 30 and the fourth conductor tracks 14 of the semiconductor component 20 that is second from the bottom, finally reach the semiconductor chip 2 thereof. In a similar manner, the second signals S2 are also conducted through the semiconductor component 20 that is second from the bottom and through the bottommost semiconductor component 10 until they are forwarded through the third conductor tracks of the bottommost semiconductor component 10 to the superordinate electronic unit 75 and are read out by the latter. The number of semiconductor components stacked one on top of another may vary as desired. As shown in FIGS. 3 and 4, in the case of electronic devices that have a plurality of semiconductor components according to embodiments of the invention stacked one above another, the data outputs of the semiconductor chips for data values to be read out are connected to the inputs of the semiconductor chip arranged underneath for the data values to be read out. A loopback configuration thereby becomes possible without subsequent constructive alterations of the individual semiconductor components.

Figure 5A:
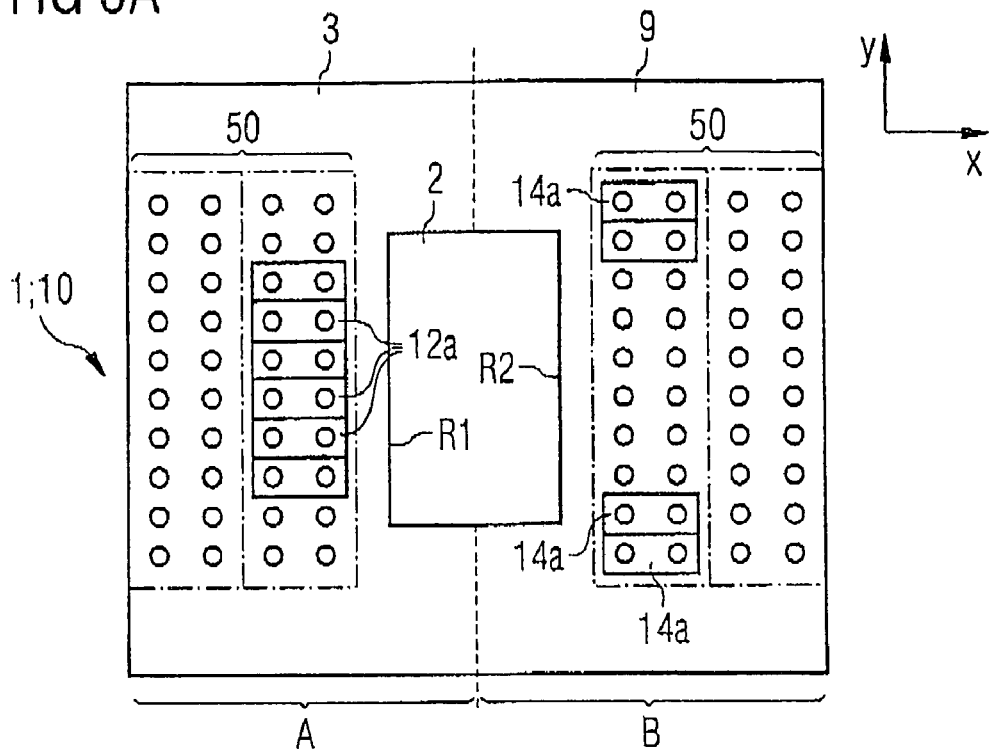
FIGS. 5A and 5B show plan views of the semiconductor component in accordance with a second embodiment.
Figure 5B:
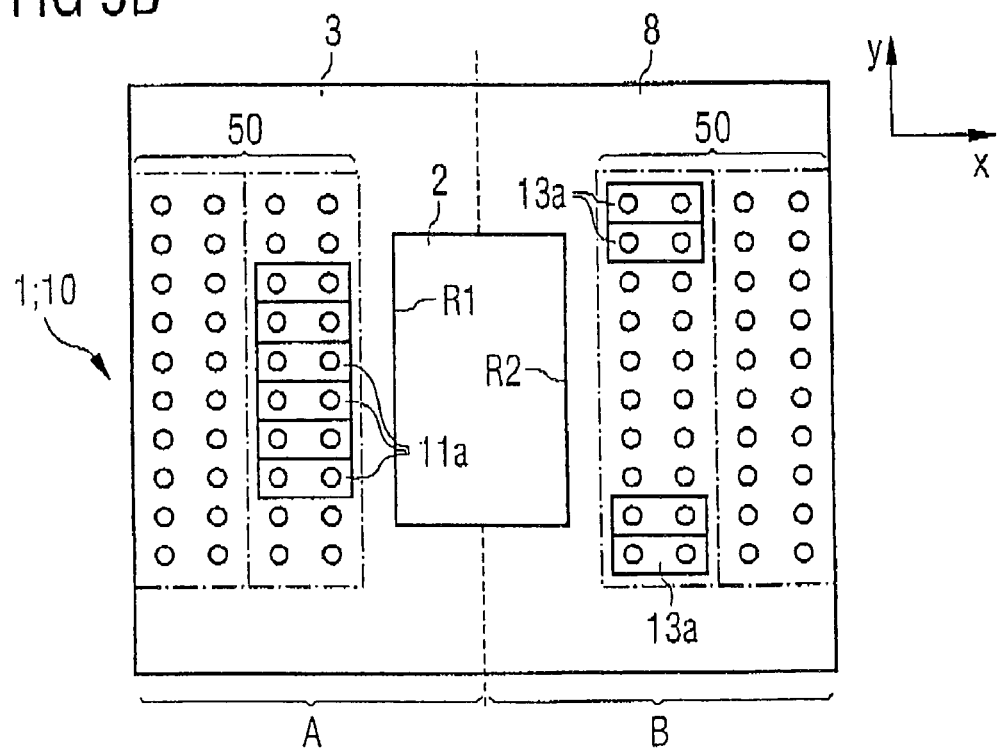

FIG. 5A and FIG. 5B show a semiconductor component in accordance with a further embodiment of the invention. The schematic plan view of FIG. 5A corresponds to the plan view of FIG. 2A and the illustration of FIG. 5B corresponds to that of FIG. 2B. In the case of the semiconductor component of FIGS. 5A and 5B, the lateral positions of the contact connections which forward the signals S1 and S2 on the top side 9 (FIG. 5A) and the underside 8 (FIG. 5B) of the semiconductor component 1 are identical. On the underside 8, the first contact connections 11a for receiving the first signals S1 are situated in the first region A of the chip housing 3. On the top side 9, the second contact connections 12a for forwarding the first signals S2 are likewise situated in the first region A. Correspondingly, both the third contact connections 13a for forwarding the second signals S1, which are arranged on the underside 8, and the fourth contact connections 14a for receiving the second signals S2, which are arranged on the top side 9, are in each case situated in the second region B of the chip housing 3. The contact-making pattern formed by the contact connections 11a and 13a and 12a and 14a, respectively, required for electrical operation is thus identical on the top side and the underside. Therefore, a plurality of semiconductor components in accordance with the second embodiment can be stacked one on top of another in any desired number with the same orientation in each case and be electrically driven jointly from the bottommost semiconductor component. FIGS. 5A and 5B furthermore show that the first, second, third and fourth contact connections 11a, 12a, 13a and 14a and thus also the ends of the first, second, third and fourth conductor tracks 11, 12, 13, 14 on the two outer sides (top side 9 and underside 8) of the chip housing 3 are at the same distance from the semiconductor chip 2 along the first direction x, along which the two edges R1 and R2 of the semiconductor chip are spaced apart from one another. As a result, the required basic surface for making contact with the semiconductor components stacked one above another is reduced even further.

FIG. 6 shows a schematic circuit diagram illustrating the loopback configuration of the semiconductor components 1 according to embodiments of the invention that are connected up to one another. The illustration in each case shows the input connections and output connections of the semiconductor chips 2 of the (for example four) semiconductor components 1 connected up to one another. The chip-side input connections are designated by 16a and 16b and the chip-side output connections are designated by 17a and 17b. The first input and output connections 16a, 17a serve for communicating the first signals, namely in particular the control commands, address commands and data values to be stored, whereas the second input and output connections 16b and 17b serve for forwarding the data values to be read out, that is to say the second signals S2. Each semiconductor chip 2 receives the sequence of the first signals S1 intended for all four semiconductor chips at its respective first input connections 16a, only a single one of which in each case is illustrated per semiconductor chip 2 in FIG. 6, and forwards said signals to its (first) output connections 17a. From there they are forwarded to the semiconductor component arranged the next higher and are received there at the chip-side first input connection 16a. In this way, the first signals S1 pass successively to all the semiconductor components 10, 20, 30 and 40.

The second signals (the data values to be read out), by contrast, are conducted through the semiconductor components not in the order of the semiconductor components 10, 20, 30 and 40, but rather in the reverse order, namely the order of the semiconductor components 40, 30, 20 and 10. Starting with the topmost semiconductor component 40, which is also the topmost semiconductor component in accordance with FIGS. 3 and 4, the data to be read out pass via the chip-side output connection 17b thereof to the corresponding input connection of the third semiconductor component 30, are conducted through the latter and are transmitted from the second output connection thereof to the second input connection 16b of the semiconductor chip 2 of the semiconductor component 20 that is second from the bottom. There they are conducted through the semiconductor chip 2 and conducted via the chip-side second output connection 17b to the second input connection 16b of the bottommost semiconductor chip 2. Via the second output connection 17b thereof, the data values to be read out from all four semiconductor chips pass to the superordinate electronic unit 75 and are evaluated there. During the evaluation, the correct order of the assignment of the received data values to the respective individual semiconductor components 10, 20, 30 and 40, which deviates from the order of the assignment of the first signals S1 to the semiconductor components, is reestablished on the part of the superordinate electronic unit.

What is claimed is:
1. A semiconductor component comprising:
an integrated semiconductor chip; and
a chip housing;
wherein the semiconductor chip has two mutually opposite lateral edges and also input and output connections;
wherein the chip housing extends laterally beyond the two mutually opposite edges of the semiconductor chip, wherein a first region of the chip housing reaches laterally as far as outside a first edge of the semiconductor chip and a second region of the chip housing reaches in an opposite direction laterally as far as outside a second edge of the semiconductor chip;
wherein the chip housing has a top side and an underside, on which contact connections are in each case provided in the first and in the second region, said contact con- nections being connected to the input and output connections of the semiconductor chip by conductor tracks within the chip housing;

wherein the chip housing has first lines for first signals and the first lines comprise first and second conductor tracks;

wherein the chip housing has second lines for second signals and the second lines comprise third and fourth conductor tracks;

wherein the first and the third conductor tracks lead from the semiconductor chip to contact connections of the chip housing that are arranged on its underside, and wherein the second and the fourth conductor tracks lead from the semiconductor chip to contact connections of the chip housing which are arranged on its top side; and wherein the first conductor tracks are connected to input connections and the second conductor tracks are connected to output connections of the semiconductor chip for the first signals, and wherein the third conductor tracks are connected to output connections and the fourth conductor tracks are connected to input connections of the semiconductor chip for the second signals.

2. The semiconductor component as claimed in claim 1, wherein those conductor tracks that are connected to input connections of the semiconductor chip are arranged in the first region of the chip housing, and wherein those conductor tracks that are connected to output connections of the semiconductor chip are arranged in the second region of the chip housing.

3. The semiconductor component as claimed in claim 1, wherein the first and the fourth conductor tracks are arranged in the first region of the chip housing and wherein the second and the third conductor tracks are arranged in the second region of the chip housing.

4. The semiconductor component as claimed in claim 1, wherein the contact connections of the second and fourth conductor tracks on the top side of the chip housing are arranged in a manner rotated through 180° relative to the positions of the contact connections of the first and third conductor tracks on the underside of the chip housing.

5. The semiconductor component as claimed in claim 1, wherein the first and the second conductor tracks are arranged in the first region of the chip housing and the third and the fourth conductor tracks are arranged in the second region of the chip housing.

6. The semiconductor component as claimed in claim 1, wherein the contact connections of the second and of the fourth conductor tracks are arranged on the top side of the chip housing in such a way that their positions attain congruence in a lateral direction with the positions of the contact connections of the first and the third conductor tracks on the underside of the chip housing.

7. The semiconductor component as claimed in claim 1, wherein the first lines conduct first signals from the underside of the chip housing via the semiconductor chip to the top side of the chip housing, whereas the second lines conduct second signals from the top side of the chip housing via the semiconductor chip to the underside of the chip housing.

8. The semiconductor component as claimed in claim 1, wherein the semiconductor component is stacked with a plurality of semiconductor components of identical type in a manner such that the contact connections on the underside of one semiconductor component in each case make contact with the contact connections on the top side of the other semiconductor component.

9. The semiconductor component as claimed in claim 8, wherein the semiconductor component is stacked with a plurality of semiconductor components of identical type in a manner such that all the semiconductor components stacked one on top of another can be placed on one another either in identically oriented fashion or in a manner rotated in each case through 180° with respect to one another.

10. The semiconductor component as claimed in claim 1, wherein the chip housing e has an arrangement of contact connections on its underside and its top side in its first and second region, wherein the contact connections of the first, second, third and fourth conductor tracks are arranged within said arrangements of contact connections.

11. The semiconductor component as claimed in claim 10, wherein, within the arrangements of contact connections, the contact connections are lined up at least along a first direction running parallel to the two lateral edges of the semiconductor chip.

12. The semiconductor component as claimed in claim 11, wherein the contact connections of the first conductor tracks are arranged along the first direction in a central region of at least one arrangement of contact connections and the contact connections of the second lines are arranged along the first direction in two outer partial regions of at least one arrangement of contact connections, wherein the central partial regions lie along the first direction in each case between two outer partial regions of the respective arrangement of contact connections.

13. The semiconductor component as claimed in claim 12, wherein, along a second direction, along which the two edges of the semiconductor chip are spaced apart from one another, the contact connections of the second and the third conductor tracks are arranged at a different distance from the semiconductor chip than the contact connections of the first and the fourth conductor tracks.

14. The semiconductor component as claimed in claim 12, wherein, along a second direction along which the two edges of the semiconductor chip are spaced apart from one another, the contact connections of the first, second, third and fourth conductor tracks are each arranged at the same distance from the semiconductor chip.

15. The semiconductor component as claimed in claim 1, wherein the first lines comprise control lines, address lines and data lines for data values to be written in, and wherein the second lines comprise data lines for data values that are to be read out or have been read out.

16. The semiconductor component as claimed in claim 15, wherein the first lines further comprise at least one clock signal line, and wherein the second lines further comprise at least one clock signal line.

17. The semiconductor component as claimed in claim 1, wherein each conductor track is embodied as a pair of two individual lines wherein the two individual lines of a respective pair serve for transmitting mutually complementary data bits.

18. The semiconductor component as claimed in claims 1, wherein the integrated semiconductor chip comprises a volatile random access memory.

19. The semiconductor component as claimed in claim 1, wherein the contact connections arranged on the underside of the chip housing are provided with solder balls.

20. An electronic device comprising at least two semiconductor components as claimed in claim 1, wherein the semiconductor components are stacked one above another in a manner such that the contact connections on the top side of a respective semiconductor component that carries a next higher semiconductor component are conductively connected to contact connections arranged on the underside of the next higher semiconductor component.

21. The electronic device as claimed in claim 20, wherein the second conductor tracks of a semiconductor component that carries a next higher component are in each case short-circuited with the first conductor tracks of the next higher semiconductor component, and wherein the fourth conductor tracks of the semiconductor component that carries the next higher semiconductor component are short-circuited with the third conductor tracks of the next higher semiconductor component.

22. The electronic device as claimed in claim 20, wherein the next higher semiconductor component is in each case arranged in a manner rotated through 180° on the component arranged underneath.

23. The electronic device as claimed in claim 20, wherein all the semiconductor components of the electronic device are stacked one on top of another in the same orientation.

24. The electronic device as claimed in claim 20, wherein the chip housings of all the semiconductor components stacked one on top of another are embodied in the same way, wherein the third and fourth conductor tracks of all the semiconductor components forward the second signals from a topmost semiconductor component as far as a bottommost semiconductor component, whereas the first and second conductor tracks of the semiconductor components forward the first signals from a bottommost semiconductor component as far as a topmost semiconductor component.

25. The electronic device as claimed in claim 20, wherein the electronic device has precisely two semiconductor components stacked one on top of another.

26. The electronic device as claimed in claim 20, wherein the electronic device has precisely four semiconductor components stacked one on top of another.

27. The electronic device as claimed in claim 20, wherein the first, second, third and fourth conductor tracks of the first and second lines of all the semiconductor devices run in such a way that the second signals pass through the semiconductor components stacked one on top of another in an opposite order to the first signals.

28. The electronic device as claimed in claim 20, wherein the first signals comprise control commands, address commands and data values to be stored, and wherein the second signals comprise data values that are to be read out or have been read out.

29. The electronic device as claimed in claim 20, wherein the third and fourth conductor tracks of the semiconductor components of the electronic device run in such a way that data values of the semiconductor chips that have been read out or are to be read out are forwarded in a cyclic order, in each case beginning with the data values of the semiconductor chip of a topmost semiconductor component and ending with the data values of the semiconductor chip of a bottommost semiconductor component.

* * * * *